United States Patent [19]

Anderson, Jr. et al.

[11] 4,318,753

[45] Mar. 9, 1982

[54] THERMAL TREATMENT AND RESULTANT MICROSTRUCTURES FOR DIRECTIONAL RECRYSTALLIZED SUPERALLOYS

[75] Inventors: Ralph E. Anderson, Jr., Palm Beach Gardens; Scott E. Hughes, Jupiter, both of Fla.

[73] Assignee: United Technologies Corporation, Hartford, Conn.

[21] Appl. No.: 84,263

[22] Filed: Oct. 12, 1979

[51] Int. Cl.$^3$ .................................................. C22F 1/10
[52] U.S. Cl. ................................... 148/3; 148/12.7 N; 148/32.5; 148/126; 148/162

[58] Field of Search ................. 148/162, 32.5, 12.7 N, 148/126, 3

[56] References Cited

U.S. PATENT DOCUMENTS 3,677,830  7/1972  Cox et al. ............................ 148/162

*Primary Examiner*—R. Dean
*Attorney, Agent, or Firm*—Charles E. Sohl

[57] ABSTRACT

A thermal treatment is described for the production of a particular microstructure in nickel base superalloys. Nickel superalloys having this microstructure are particularly adapted to be directionally recrystallized.

6 Claims, 4 Drawing Figures

FIG. 1  500 X
FIG. 2  500 X
FIG. 3  500 X
FIG. 4  1/3 X
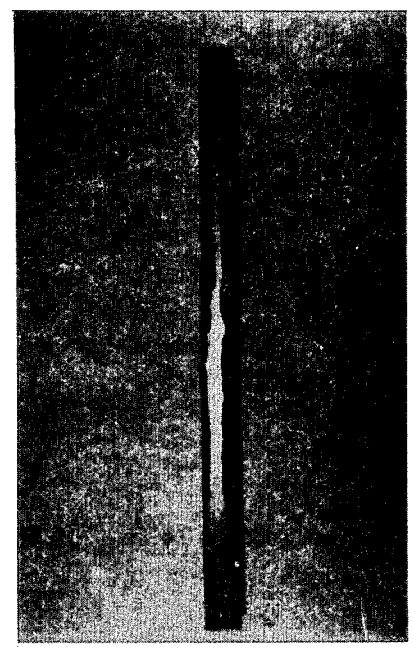

THERMAL TREATMENT AND RESULTANT MICROSTRUCTURES FOR DIRECTIONAL RECRYSTALLIZED SUPERALLOYS

BACKGROUND OF THE INVENTION

1. Field of the Invention

This invention relates to the thermal treatment of nickel base superalloys in preparation for directional recrystallization. This invention also relates to the resultant microstructure which is amenable to directional recrystallization.

2. Description of the Prior Art

The mechanical properties of metals are strongly affected by grain boundaries. At low temperatures, grain boundaries are generally stronger than the material within the grains, but at high temperatures the reverse is true. At elevated temperatures, creep is usually observed to occur much more rapidly in fine grain materials than coarse grain materials. For this reason, coarse grained materials are usually preferred for stressed applications at elevated temperatures.

Improvements in creep properties of coarse grained materials may be obtained if the grains can be significantly elongated in the direction of stress. This elongated grain material has significantly fewer grain boundaries transverse to the stress axis; and accordingly, has improved high temperature properties in the elongation direction. As used herein, the term "elongated grain" is intended also to encompass single crystal material, which are those characterized by the absence of internal grain boundaries.

Two general techniques exist for producing such material. One method, known as directional solidification (D.S.), involves controlling the heat flow and other conditions during the solidification process to produce an elongated microstructure. This technique is discussed in U.S. Pat. No. 3,260,505 issued to VerSnyder of common assignee with the present application. The process described in this prior patent produces elongated grains in a cast structure.

The second method involves controlled recrystallization (usually after deformation). In its best known form, this type of process involves straining the material a small, but critical amount, to produce a particular dislocation density, and then heating to above the recrystallization temperature under conditions which encourage grain growth rather than grain nucleation. This process produces elongated grains in a wrought microstructure. The heating is usually performed in a moving thermal gradient and the recrystallized grains tend to grow along the axis of gradient motion. This process is reviewed in the book "The Art and Science of Growing Crystals," edited by J. J. Gilman, John Wiley Publishing Co., (1964) pages 415 through 479.

More recent references to this type of process include U.S. Pat. Nos. 3,850,702; 3,746,581 and 3,772,090.

U.S. Pat. No. 3,850,702 describes a process applicable to the gamma/gamma prime alloys in which the alloy is heat treated to produce an all gamma structure prior to straining. The straining step is performed at relatively low temperatures and reprecipitation of the gamma phase occurs during annealing. Both U.S. Pat. Nos. 3,746,581 and 3,772,090 are processes applicable chiefly to dispersion strengthened alloys. In U.S. Pat. No. 3,772,090, the strain is imparted at low temperatures, while in U.S. Pat. No. 3,746,581 the strain is imparted by hot extrusion under controlled conditions.

There exists another type of recrystallization process which is known as secondary recrystallization. In this form of recrystallization, certain existing grains grow at the expense of others without the nucleation of new grains. It is known that soluble second phase particles can effect secondary recrystallization. This is described in Trans. AIME (1939), Vol. 180, pages 163 through 192 and Trans. AIME (1961), Vol. 221, pages 439 through 445 with regard to certain iron base alloys. It does not appear that this process has been used in any practical fashion, and it further does not appear that any use has been made of thermal gradient in secondary recrystallization.

U.S. Pat. No. 3,975,219 describes a directional recrystallization process for nickel base superalloy involving hot forging under controlled conditions to produce a uniform dislocation density followed by directional recrystallization.

U.S. Pat. No. 3,677,830 describes a duplex heat treatment for nickel base superalloys including a heat treatment at a temperature between 25° and 100° below the gamma prime solvus followed by a second heat treatment below but within 25° of the gamma prime solvus. The objective of this invention is the provision of a uniform microstructure in certain superalloys.

SUMMARY OF THE INVENTION

This invention deals with a thermal technique which can be used to produce a particular microstructure in gamma/gamma prime superalloys. This microstructure consists of a fine grain size with the gamma prime phase being concentrated at the grain boundaries. This particular microstructure can readily be directional recrystallized by passage through a thermal gradient having hot end temperature in excess of the gamma prime solvus. Passage of such a microstructure through a thermal gradient can be used to provide an oriented microstructure through directional grain growth.

It is an object of this invention to provide a thermal process for producing a particular microstructure in gamma/gamma prime superalloys.

It is a further object of this invention to provide particular microstructure in superalloys in which the gamma prime phase is concentrated at the grain boundaries.

Finally, it is an object of this invention to provide a complete process for producing directionally recrystallized nickel base superalloy articles.

The foregoing and other objects, features and advantages of the present invention will become more apparent in light of the following detailed description of the preferred embodiments thereof as shown in the accompanying drawings.

BRIEF DESCRIPTION OF THE DRAWINGS

FIG. 1 shows the microstructure of alloy RSR 143 immediately after hot extrusion.

FIG. 2 shows the microstructure of alloy RSR 143 after hot rolling.

FIG. 3 shows the microstructure of alloy RSR 143 after conditioning according to the present invention.

FIG. 4 shows a macro photograph of alloy RSR 143 after directional recrystallization.

DESCRIPTION OF THE PREFERRED EMBODIMENTS

The present invention includes a thermal process for modifying the gamma prime phase distribution in nickel base superalloys. The process is entirely thermal and requires no mechanical working. The redistribution of the gamma phase is accomplished by heating near the gamma prime solvus under controlled conditions.

The process includes several parameters. These include the starting material condition, the heat up rate (particularly in conjunction with alloys having a fine gamma prime particle size in their initial condition), the heat treatment temperature, the time at elevated temperature and especially the cooling rate.

The starting material must have a fine grain size and a relatively high degree of compositional homogeneity. The grain size must be ASTM 2-3 or finer and is preferably ASTM 4-5 or finer.

ASTM grain size 2 corresponds to an average grain diameter of 0.18 mm, ASTM 3 to 0.125 mm, ASTM 4 to 0.109 mm and ASTM 5 to 0.062 mm.

The degree of homogeneity required cannot be precisely described. All of the experimental work done in the development of this process has been work performed on material formed from powdered metals. It is well known that powder metallurgy techniques result in good homogeneity, however, we do not believe that there is anything inherent in the powder metallurgy process (aside from homogeneity and fine grain size) which is required for the success of this invention. It is believed that any other process employing, for example, cast starting material would have equal utility with this invention assuming that the requirements of grain size and homogeneity, at least equal to that resulting from powder metallurgy, could be met.

It is a surprising and unexpected feature of this invention that the degree of strain or the initial dislocation density in the microstructure appears unimportant to the success of the final directional recrystallization step. Articles having the microstructure described below have been successfully directionally recrystallized in conditions ranging from highly strained to essentially fully annealed. Further, the uniformity of the strain or dislocation density appears to play no significant role in the success of final directional recrystallization step.

With this starting material of the previously described grain size and homogeneity, it is necessary to manipulate the gamma prime phase to achieve a particular microstructure which will now be described.

The microstructure which we believe to be essential to successful directional recrystallization comprises a grain size of ASTM 2-3, and preferably ASTM 4-5, relatively large gamma prime particles located at the grain boundaries triple points having an average diameter in the range of 80-140 microns in diameter and closely spaced gamma prime particles located at the grain boundaries having an average particle size between 7 and 60 microns in diameter with the grain boundary gamma prime particles being spaced apart by an amount less than about twice the average grain boundary particle diameter. We have found that this desired microstructure can be obtained in any homogeneous fine grained starting material (of gamma/gamma prime nickel base superalloys) regardless of the initial gamma prime particle distribution by the process to be described.

This process involves the redistribution of the gamma prime phase from fine intergranular and intragranular particles in the starting material to coarser gamma prime particles located primarily at the grain boundaries in the final material. This redistribution is achieved by a heating step at an elevated temperature, below but very near the gamma prime solvus, which effectively dissolves most of the gamma prime phase into solution. This dissolved gamma prime phase is subsequently reprecipitated at the grain boundaries during a subsequent controlled cooling step. Some difficulty may be encountered in that at the temperature required for redistribution of the gamma prime the grain boundaries are relatively mobile. During this processing sequence, it is important that the grain size not increase by any significant amount. Thus the invention also provides a method for significantly redistributing the gamma prime phase without permitting significant grain growth.

The temperature at which the substantial dissolution of the gamma prime phase occurs is below, but within about 100° F. of the gamma prime solvus. Also, at this temperature the atomic mobilities of the various elements are high and redistribution occurs with some rapidity. By holding the material at this temperature for a period of time between 1 and about 10 hours, the gamma prime phase within the grains will largely dissolve into solution and a certain amount of reprecipitation in the gamma phase at the triple points will occur.

After holding the alloy in this temperature range near the gamma prime solvus, the alloy is then cooled at a controlled rate so as to controllably precipitate the gamma prime phase both at the triple points where three grains meet and at the boundaries between two grains.

The broad range for the cooling rate is about 5° F. to about 300° F./min. This cooling rate need only to be controlled during cooling through the range of about 250° F. below the gamma prime solvus; and for some alloys, the cooling rate need be controlled over an even smaller temperature range. The required cooling conditions will vary as a function of both composition and to some extent as a function of the exact heat treatment temperature. Of course, sample geometry has a great effect on cooling rate. By way of illustration, moderately sized test samples cool at a rate of 1000°-3000° F./min in this temperature range. A slower cooling rate may be achieved by cooling in vacuum or in an atmosphere such as argon, or by withdrawing the material into a second furnace at a lower temperature.

The skilled artisan can readily determine the optimum cooling rate for his particular situation by means of a few simple cooling tests keeping in mind that the desired final microstructure consists of 80-140 micron diameter gamma prime particles at the triple point and 7-60 micron diameter gamma prime particles in the grain boundaries. As a rule, if the gamma prime particle size is too small, the cooling rate should be decreased whereas if the gamma prime particle size is too large, the cooling rate should be increased.

The preceding discussion describes the essentials of the basic invention process. We will now describe certain refinements and modifications to the process which we have found to be desirable for treating alloys of certain specific compositions and certain particular starting microstructures.

The first such modification concerns the heat up rate employed in heating the starting article to the heat treatment temperature. We have found that if the starting material has a very fine gamma prime morphology and particularly if this initial microstructure does not include substantial amounts of gamma prime in the boundaries and at the triple points then the heat up rate must be controlled to be relatively slow. By "fine gamma prime morphology," we mean an average intergranular gamma prime particle size of less than about 2 microns and that less than 20% of the gamma prime phase is present in the grain boundaries.

The reason for this slow heat up, for a fine gamma prime morphology, is that if such an article is rapidly heated the fine gamma prime particles within the grains will dissolve and substantial amounts of grain growth may occur before sufficient gamma prime particles can form at the triple points to pin the grain boundaries. This increase in grain size has been observed to be detrimental to the subsequent directional recrystallization of this material.

By way of example, we believe that by controlling the heat up rate to be from about 5° F. to 100° F./min in the temperature range within 200° F. of the gamma prime solvus that this problem will be substantially avoided. While essential only in the case of fine starting gamma prime size, there is no reason why this step cannot be employed with all superalloy articles.

As an alternative to a slow heat up rate, we have found it possible to use a two step heat treatment in which the first heat treatment step is performed between about 51° and 100° F. below the gamma prime solvus, and a second heat treatment is performed at a temperature within 50° F., but below the gamma prime solvus. The first treatment should preferably be for a period of time of from about 0.5 to 8 hours, and the second treatment for a time of about 0.1 to 4 hours.

With this procedure, the principal effect of the first heat treatment step is to permit the formation of the gamma prime phase in the grain boundaries and at the triple points without the occurrence of significant grain growth. The principal effect of the second heat treatment is to dissolve a certain amount of the gamma prime phase for subsequent precipitation during cooling. The grain boundary gamma prime formed during the first step is effective to prevent grain growth during the second step. Both the controlled heat up and the two step heat treatment processes have been found to be most essential in connection with alloys for a very fine gamma prime morphology, however, there is no reason why these steps could not be applied to all alloys.

Following the heat treatment step near the gamma prime solvus, the alloy is cooled at a controlled rate a permit controlled reprecipitation in the gamma prime phase in the grain boundaries. We have found that this required cooling rate is somewhat dependent on an alloy composition. For the general range of nickel base superalloys, the required rate will fall in the range of 5°–300° F./min. For alloys containing in excess of about 1½ atomic percent of refractory metals that the cooling rate should be confined to be about 5° and 100° F./min within the temperature range of 250° F. below the gamma prime solvus.

The refractory elements which include tungsten, tantalum, rhenium, osmium and hafnium have a lower rate of diffusion within superalloys and the presence of substantial amounts of these elements slows down the redistribution of the gamma prime phase to the grain boundaries to the point that a lower cooling rate is required.

Once the previously described microstructure has been obtained, an elongated microstructure can be developed by passing the conditioned microstructure through a thermal gradient. The thermal gradient should be as steep as possible of the hot end, and the thermal gradient should exceed the gamma prime solvus temperature of the alloy in question. The rate of translation of the article throughout the thermal gradient must be relatively slow, on the order of 1"/hr or less.

While the passage of superalloy articles through thermal gradient to achieve oriented microstructures is known in the art, we believe that the present process is substantially different from the prior art process.

In the prior art process, the alloys to be directional recrystallized were preconditioned by controlled deformation so as to incorporate substantial strain energy into the microstructure and this strain energy is the driving force for the subsequent oriented grain growth. In these prior art processes the oriented grains grew from newly nucleated grains.

In the present process, the driving force is the reduction in grain boundary area. This reduction in grain boundary area is the reason for the requirement of the fine grain size. Further, the present process for elongated grains are produced by grain growth of existing grains; we do not believe that any significant degree of nucleation of new grains occurs. Thus, the present process differs from the prior art both in the lack of nucleation of new grains and in the major dependence upon reduction of grain boundary energy as the driving force.

As an aid to understanding the practicing of this invention, Tables I and II present the relevant information which details how the invention process is performed with respect to six commercial superalloys.

Table I lists the compositions of the superalloys and the gamma prime solvus of these alloys. Table II shows the conditioning heat treatment parameters which were used to develop the desired microstructure in these alloys. The parameters included the heat up rate employed in heating these alloys to the conditioning temperature shown. These alloys were held at these conditioning temperatures for the indicated time and then cooled at the rate shown within a temperature range of about 250° F. below the conditioning temperature. These parameters provided the desired microstructures, and we believe that those skilled in the art can employ this process with the indicated superalloys with the aid of this information and can extrapolate from these commercial superalloys to use the process with other alloys.

TABLE I

| | ALLOY COMPOSITIONS IN WEIGHT PERCENTS | | | | | | | | |
|---|---|---|---|---|---|---|---|---|---|
| | Ni | Cr | Co | Ti | Al | Mo | C | W | Others | T of γ'Solvus |
| MAR-M-200 | R | 9 | 10 | 2 | 5 | — | .15 | 12.5 | Cb 1.0, B .015, Zr .05 | 2160 |
| AF2-10A | R | 12 | 10 | 3.0 | 4.6 | 3.0 | .35 | 6.0 | Ta 1.5, | 2110 |

TABLE I-continued

| | ALLOY COMPOSITIONS IN WEIGHT PERCENTS | | | | | | | | |
|---|---|---|---|---|---|---|---|---|---|
| | Ni | Cr | Co | Ti | Al | Mo | C | W | Others | T of γ'Solvus |
| NX-188 | R | — | — | — | 8 | 18 | — | — | Zr .10, B .015 | 2380 |
| Astroloy(LC) | R | 15 | 17 | 3.5 | 4.0 | 5.0 | .06 | — | B 0.03, V 1.0, Hf 1.0 | 2050 |
| NASA IIb-11 | R | 9.75 | 10.0 | 1.0 | 4.5 | 2.0 | 0.13 | 5.5 | Ta 8.0, B .02, Zr 0.03 | 2180 |
| IN 100 | R | 12.4 | 18.5 | 4.3 | 5.0 | 3.2 | .07 | — | V .8, Zr 0.06, B .015. | 2140 |

TABLE II

CONDITIONING HEAT TREATMENT PARAMETERS

| ALLOY | HEAT UP RATE | TEMP. | TIME | COOLING RATE |
|---|---|---|---|---|
| MAR-M-200 (As Extruded) | 50° F./Min | 2140 | 2 hrs. | 25° F./Min |
| ASTROLOY (As Extruded) | 20° F./Min | 2025 | 1 hr. | 10° F./Min |
| IN 100 (Isothermally Forged Pancake) | 10° F./Min | 2125 | 2 hrs. | 100° F./Min |
| NX-188 (As Extruded) | No Conditioning Necessary, Necklace Formed On Cooldown From Extrusion | | | |
| AF2-1DA (Isothermally Forged Pancake) | 25° F./Min | 2075 | 2 hrs. | 100° F./Min |
| NASA IIb-11 (As Extruded) | 5° F./Min | 2140 | 4 hrs. | 5° F./Min |

All of these alloys described in Tables I and II were produced by powder metallurgy techniques from powder which had been rapidly cooled at rates of about $10^5$ F./sec. This high cooling rate does not appear to be necessary to the performance of this invention since the major effect of the rapid cooling is slightly improved homogeneity.

The process of the invention may be better understood in reference to the following illustrative example. An alloy referred to as RSR 143 was employed. This experimental alloy has a nominal composition of 5.8% aluminum, 14.3% molybdenum, 6% tantalum, balance nickel. The gamma prime solvus of this alloy is about 2375° F. This is a gamma/gamma prime type superalloy and was fabricated by a rotary atomization technique in which molten particles of the alloy were solidified at the rate of about $10^5$ C./sec. The powder was compacted by extrusion at a temperature of 2300° F. and an extrusion ratio of 6:1. The resultant grain size was about ASTM 8, and the as extruded microstructure did not show a significant concentration of the gamma prime phase at the grain boundaries to permit directional recrystallization.

The extruded bar diameter was 1.25 inches. These bars were isothermally side upset 15% at 2075° F. Following this forging step, the articles were hot rolled at 2335° F. using warmed rolls. Approximately 15 rolling passes with an average reduction per pass of about 0.060 were employed the article was reheated at 2335° F. between each pass. Attempts to directionally recrystallize the material in this condition were unsuccessful.

As a result of the fine grain size and lack of gamma prime particles in the grain boundaries in the rolled material a two step conditioning heat treatment was employed. The alloy was first heat treated at 2300° F. for four hours to develop a significant amount of the gamma prime phase at the grain boundary triple points as well as some gamma prime in the grain boundaries. Following this 2300° F. heat treatment, the alloy was air cooled to room temperature. The alloy was then heat treated at 2340° F. for one hour and then cooled at a rate of about 100° F./min. This cooling was accomplished by placing the alloy in a furnace at 1500° F. for a period of about ten minutes. As an aid in achieving a slow cooling rate, the alloy, which was in the form of a thin strip, was held in a larger fixture which provided a slower cooling rate. Following the 1500° F. furnace treatment, the alloy was air cooled to room temperature.

FIG. 1 shows the as extruded microstructure, and it can be seen that while there are some massive gamma prime particles in the grain boundaries, these particles are not uniformly distributed, and there are large grain boundary segments that do not contain any substantial size gamma prime particles. FIG. 2 shows a substantially changed microstructure after rolling, but the changed microstructure doesn't meet the requirements for directional recrystallization.

FIG. 3 shows the microstructure after the conditioning heat treatment described and a substantial change in the gamma prime distribution can be seen. In particular, there are large gamma prime particles which are uniformly present at the grain boundary triple points and small particles are evenly distributed in the grain boundaries.

The microstructure shown in FIG. 3 satisfies those parameters previously described with regard to gamma prime morphology.

Directional recrystallization experiments were performed on a sample of the RSR 143 alloy in both the as extruded condition and the heat treated condition. The furnace used provided a thermal gradient of about 150° F./in with a maximum temperature of about 2430° F. The as extruded material was advanced through this thermal gradient at a rate of ¼"/hr. No directional grain growth was observed. When the conditioned material advanced through the furnace at a rate of 3/16 in/hr, an excellent grain growth was observed.

FIG. 4 shows a macro photograph of the RSR 143 conditioned alloy after directional recrystallization showing the nature and extent of the elongated microstructure.

Although this invention has been shown and described with respect to a preferred embodiment thereof, it should be understood by those skilled in the art that various changes and omissions in the form and detail thereof may be made therein without departing from the spirit and scope of the invention.

Having thus described a typical embodiment of our invention, that which we claim as new and desire to secure by Letters Patent of the United States is:

1. A method of conditioning a nickel base superalloy article in preparation for directional recrystallization including the steps of:
   a. providing the article in a condition of homogeneity at least equal to that provided by powder metallurgy techniques and with a grain size of ASTM 3-4 or smaller;
   b. heating the article to a temperature below, but within about 100° F. of the gamma prime solvus for from about 1 to about 10 hours to dissolve a substantial quantity of the gamma prime phase and to permit some precipitation and agglomeration of the gamma prime phase at triple points and in grain boundaries without permitting significant grain growth;
   c. cooling the article at a controlled rate between about 5° F./min and 300° F./min so as to precipitate and grow gamma prime phase particles at the triple points (80-140 microns in average size) and in the grain boundaries (7-60 microns in average size) with the cooling rate being controlled within the temperature range of below but within about 250° F. of the gamma prime solvus.

2. A method as in claim 1 in which the superalloy article has an initial intergranular gamma prime particle size of less than about 3 microns wherein step (b) is performed in two stages, an initial exposure at a temperature 51°-100° F. below the gamma prime solvus and a second exposure at a temperature of 1°-50° F. below the gamma prime solvus.

3. A method as in claim 1 in which the superalloy article has an initial intergranular gamma prime particle size of less than about 5 microns, in which the heat up rate prior to step (b) is constrained to be less than about 25° F. per minute in the temperature range within 200° F. of the gamma prime solvus.

4. A method as in claim 3 in which the superalloy article contains in excess of about 1.5 atomic percent of (W+Ta+Re+Os+Hf) in which the cooling step is constrained to be within 5° F.-100° F. per minute until the article has cooled to a temperature of at least 250° F. below the gamma prime solvus.

5. A method for producing an elongated grain microstructure in a nickel base superalloy article including the following steps:
   a. providing a nickel base superalloy article having a compositional homogeneity at least equal to that provided by powder metallurgy techniques, and having a grain size of ASTM 3-4 or smaller;
   b. heating the article to a temperature below, but within about 100° F. of the gamma prime solvus for a period of time sufficient to dissolve a substantial quantity of the gamma prime phase and to permit some agglomeration of the gamma prime phase at triple points and in grain boundaries without permitting significant grain growth;
   c. cooling the article at a controlled rate within 5° F. per minute and 300° F. per minute so as to precipitate and grow gamma prime phase particles at the triple points (80-140 microns in size) and in the grain boundaries (7-60 microns in size);
   d. passing the article through a thermal gradient whose hot ends exceeds the gamma prime solvus, but is less than the article melting point at a rate sufficient to cause elongated growth of existing grains, said growth occurring primarily as a result of a decrease in total grain boundary area.

6. A nickel base superalloy article particularly adapted to directional recrystallization said article having a microstructure with a grain size of less than ASTM 3-5, gamma prime particles at grain boundary triple points having an average diameter of about 80-140 microns; and gamma prime particles in the grain boundaries having an average diameter of about 7-60 microns and an average particle spacing of not less than about twice the average particle diameter.

* * * * *